United States Patent
Marbot et al.

[11] Patent Number: 5,327,031
[45] Date of Patent: Jul. 5, 1994

[54] VARIABLE-DELAY CIRCUIT

[75] Inventors: Roland Marbot, Versailles; Andrew Cofler; Michel Combes, both of Paris; Jean-Claude Lebihan, Montrouge; Reza Nezamzadeh-Moosavi, Bois D'Arcy, all of France

[73] Assignee: Bull S.A., Paris, France

[21] Appl. No.: 47,545

[22] Filed: Mar. 8, 1993

[30] Foreign Application Priority Data

Mar. 24, 1992 [FR] France ............... 92 03527

[51] Int. Cl.$^5$ ............................. H03K 5/13
[52] U.S. Cl. .................. 307/603; 307/605; 307/608; 328/55
[58] Field of Search ......... 307/603, 595, 608, 597, 307/596, 358, 262, 600, 601, 605; 328/66

[56] References Cited

U.S. PATENT DOCUMENTS

| | | | |
|---|---|---|---|
| 4,795,923 | 1/1989 | Dobos | 307/605 |
| 4,797,586 | 1/1989 | Traa | 307/608 |
| 4,947,064 | 8/1990 | Kim et al. | 302/605 |
| 5,063,311 | 11/1991 | Swapp | 307/608 |
| 5,111,085 | 5/1992 | Stewart | 307/603 |
| 5,118,975 | 6/1992 | Hillis et al. | 307/595 |
| 5,160,863 | 11/1992 | Hui | 307/601 |
| 5,185,540 | 2/1993 | Boudry | 307/605 |
| 5,231,319 | 7/1993 | Crafts et al. | 307/605 |

FOREIGN PATENT DOCUMENTS

| | | |
|---|---|---|
| 0306662 | 3/1987 | European Pat. Off. |
| 0347983 | 12/1989 | European Pat. Off. |
| 0171022 | 2/1986 | Japan ............... 307/605 |

OTHER PUBLICATIONS

Technical note "Transistor Memory Precharge Circuit" by Andrew G. P. Dingwall, sheet 1 of 2, a publication of RCA, Feb. 18, 1976.
Patent Abstracts of Japan, vol. 10, No. 213 (E-422) (2269) 25 Jul. 1986 (Hitachi Ltd).

*Primary Examiner*—Timothy P. Callahan
*Assistant Examiner*—Dinh Le
*Attorney, Agent, or Firm*—Kerkam, Stowell, Kondracki & Clarke

[57] ABSTRACT

A variable delay circuit including a fixed delay circuit (D1) furnishing a signal ($e_1$) that is delayed with respect to the input signal ($e_0$). A combination circuit (C) furnishes a combination signal ($f_K$) resulting from the superposition, with weighting and an integral effect of the input ($e_0$) and delayed ($e_1$) signals. The assembly is dimensioned such that the fixed delay (T) is less than the transition time that the combination signal ($f_K$) has when only the input signal ($e_0$) is applied.

11 Claims, 6 Drawing Sheets

VARIABLE-DELAY CIRCUIT

The invention relates to delay devices that are adjustable as a function of a set-point delay, which may be in the form of a digital variable.

Adjustable delay circuits have numerous applications and are used in particular when the phase between two logical signals is to be adjusted. In that case, the first of these signals is applied to the input of a delay circuit, and measuring the phase displacement between the output signal and the input signal is used to control the adjustment of the delay circuit.

Automatic phase control can be done by means of an analog or digital adjusting signal; the digital version is often preferred, because it is less sensitive to interference and to the attenuation involved in signal transmission. Moreover, when it is embodied as an integrated circuit, it is less sensitive to production variations.

A first known way to achieve a digitally controlled delay circuit consists in using a plurality of elementary gates, for example of the inverter type, associated with a digitally controlled interconnection system and enabling the cascade connection of a variable number of elementary gates. However, this type of circuit is limited to being employed in cases that do not require precision adjustment of any delay shorter than the intrinsic delay of the elementary gate.

Another known solution is to use a circuit of the resistor-capacitor type, where the resistor is constituted by a plurality of elementary resistors connected selectively in parallel as a function of the digital control. In that case, the delay is defined by the time constant of the circuit. If all the elementary resistors have the same resistance, then the delay obtained is inversely proportional to the number of resistors selected. To obtain a constant adjustment precision over the entire adjustment range, it is necessary for the function linking the delay to the digital adjustment variable to be as nearly as possible a linear function. The response obtained by the above solution is accordingly very far from a linear relationship. To approach such linearity, the elementary resistors must be dimensioned for quite precise resistances that are all different from one another. This outcome is very difficult to obtain in the case of an integrated version. Moreover, it would be necessary to provide one such circuit for each signal that is to be adjusted.

For example, if the delay circuit is intended to be used in a phase-locked loop of the type described in European Patent Application published under No. 441 684, filed Jan. 30, 1991, and entitled "Circuit verrouillé en phase et multiplieur de fréquence en résultant" [PHASE-LOCKED LOOP AND RESULTANT FREQUENCY MULTIPLIER], corresponding to U.S. application Ser. No. 07/762,018, filed Sep. 18, 1991, in the name of Roland Marbot and assigned to the assignee of the present invention, then the foregoing solution is not satisfactory, because of its bulk and its sensitivity to production variations.

SUMMARY OF THE INVENTION

The object of the invention is to propose a delay circuit enabling precise adjustment with the capability of obtaining a minimum delay shorter than the intrinsic delay of the elementary gates of the technology chosen, while assuring a linear response, with sufficient approximation, of the delay as a function of the set-point delay.

To this end, the subject of the invention is a delay circuit furnishing an output signal having a delay with respect to a logical input signal, the delay being adjustable as a function of a set-point delay, the circuit being characterized in that it includes a fixed delay circuit receiving the input signal and furnishing a delayed signal having a fixed delay with respect to the input signal, and a combination circuit with two inputs receiving the input signal and the delayed signal, respectively, and including a control input receiving a control variable representing the set point, the combination circuit being designed in such a way as to furnish at its output a combination signal resulting from the superposition with weighting and an integral effect of the signals applied to its inputs, the weighting consisting in assigning two weighting coefficients associated respectively with the input signal and the delayed signal whose values are a function of the control variable; and that the combination circuit and/or the fixed delay circuit are dimensioned such that the fixed delay is less than the transition time that the combination signal has when the combination circuit receives only the input signal.

The combination signal furnished by the combination circuit is normally intended to be applied to the input of a circuit, such as a shaping circuit, having a threshold effect. Hence the effective delay of the output signal with respect to the input signal will be dependent on the level of the input threshold of these circuits. It is therefore desirable for the maximum and minimum amplitudes of the combination signal to be independent of the set-point delay.

To that end, the invention is also characterized in that the sum of the two weighting coefficients is constant.

In practice, the integral effects will be produced by an integrator or a circuit with a time constant that always has a saturation effect, defining the extreme levels of the combination signal. The transition time will accordingly be defined as the period of time during which the combination signal varies by a linear or quasi-linear function when the combination circuit receives only the inlet signal. The fact that a fixed delay less than the transition time is imposed assures that the delay of the output signal with respect to the input signal will have no discontinuity as a function of the weighting coefficients. In order that the variation of the delay as a function of the set-point delay will vary over the entire adjustment range by a practically linear function of the set point, the combination circuit and/or the fixed delay circuit may be dimensioned so that the fixed delay will be equal to one-half the transition time.

The subject of the invention is also several embodiments especially designed to be capable of using ECL and CMOS technologies.

BRIEF DESCRIPTION OF THE DRAWINGS

These embodiments and other aspects and advantages of the invention will become apparent from the ensuing description, taken in conjunction with the drawings.

DESCRIPTION OF THE PREFERRED EMBODIMENTS

Figure 1:
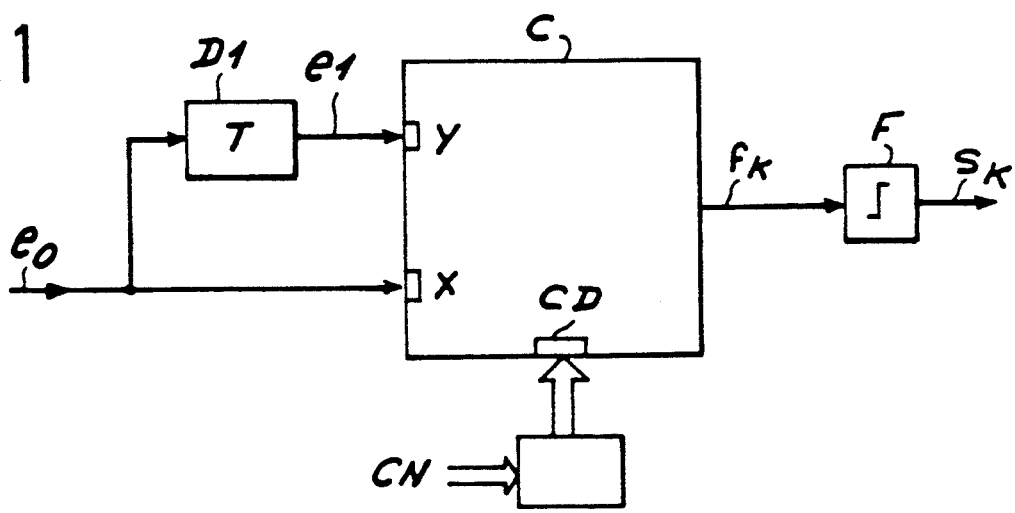
FIG. 1 shows the basic layout of the delay circuit according to the invention.

The delay circuit according to the invention is schematically shown in FIG. 1. A fixed delay circuit D1 receives the logical input signal $e_0$ and at its output furnishes the delayed signal $e_1$. The signals $e_0$ and $e_1$ are applied to the inputs x and y, respectively, of a combination circuit C which at its output furnishes the combination signal $f_K$. The combination circuit C includes a control input CD that receives a command representing the weighting coefficients of the combination performed by the circuit C. This command is a function of the set-point delay CN.

The combination signal $f_K$ is applied to the input of a shaping circuit F, whose output furnishes the output signal $s_K$.

To simplify the explanation below, standardized magnitudes of the signals involved will be assumed, and it will be assumed that the weighting coefficients assigned to the signals $e_0$ and $e_1$ have the values K and $1-K$, respectively, where K is between 0 and 1.

Under these conditions, the circuit C is designed to make the combination $Ke_0 + (1-K)e_1$ with integration with respect to time.

Figure 2:
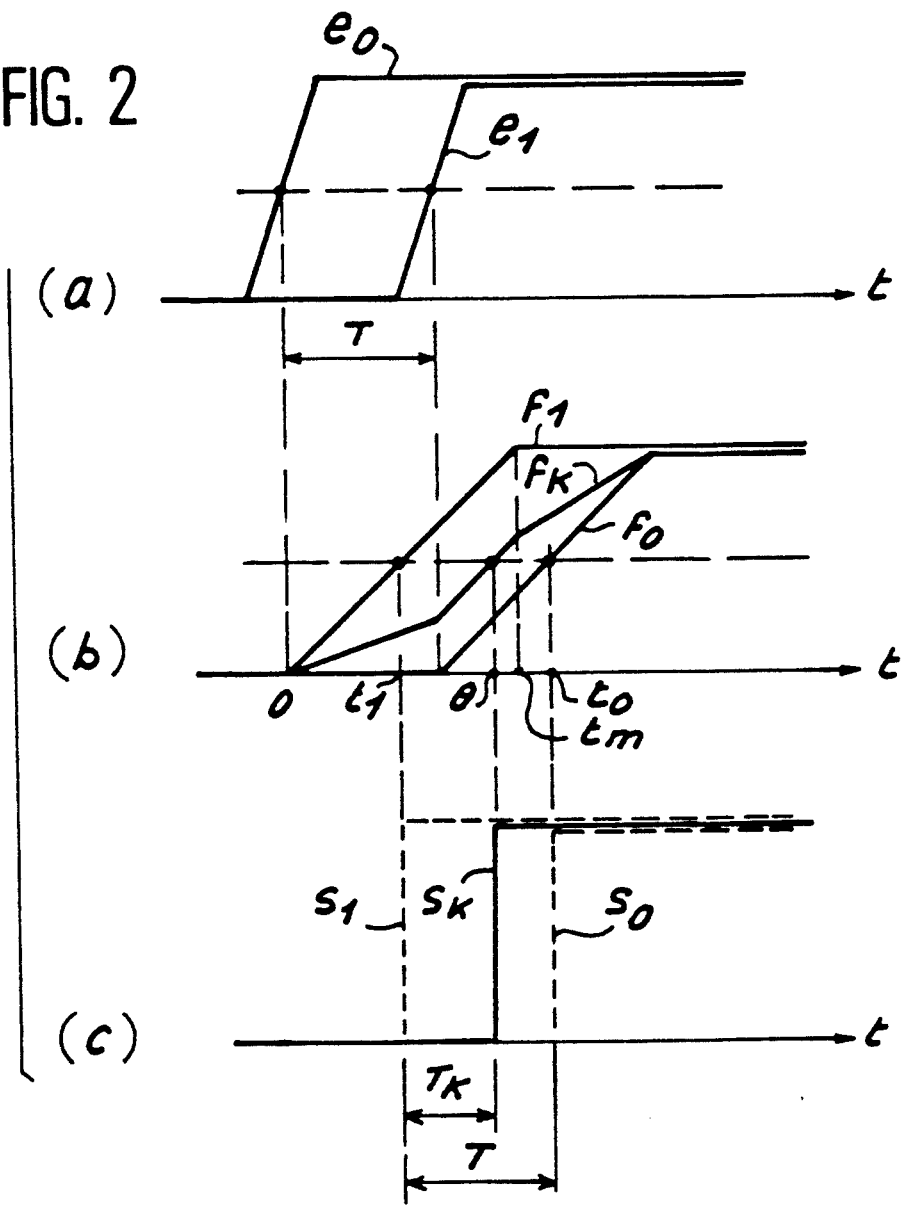
FIG. 2 shows timing diagrams with which the operation of the circuit of FIG. 1 can be explained.

The timing diagrams shown in FIG. 2 make it possible to explain the operation of the circuit of FIG. 1.

The timing diagram (a) shows the signals $e_0$ and $e_1$ applied to the inputs X and Y of the combination circuit C. Since the signal $e_0$ is the logical signal, it has a steep transition edge between a first and a second level, which is followed by another edge (not shown) returning the signal to its first level. The delayed signal $e_1$ has been shown as a signal identical to $e_0$ but delayed by the delay T defined by the delay circuit D1. In practice, the edge of the signal $e_0$ is defined by the instant when the signal $e_0$ attains a threshold value of the downstream circuit. In general, the threshold value corresponds to the intermediate level between the minimum and the maximum levels of the signal $e_0$. The same is true for the signal e1, and in this case, this signal may have a different shape from that shown. The delay T then being defined as the period of time separating the instants when the signal $e_0$ and the signal $e_1$ reach the threshold value.

The timing diagram (b) shows the combination signal $f_K$ for different values of the weighing coefficient K. It is understood that the form of the signals shown is a simplified representation of the signals that may be obtained with actual circuits.

Nevertheless, it is appropriate to note that this illustration is not far from reality. In particular, a saturation stage will always be observed, because the integral of a pulse in any case is finally limited to the values of the supply potentials.

The signal $f_1$ corresponds to the case where K=1, or in other words when the weighting coefficient applied to the signal $e_1$ is zero. This signal is trapezoidal in form, with the leading edge beginning at time 0, corresponding to the instant when the signal $e_0$ reaches the threshold value. The signal $f_1$ increases linearly until time tm, where it reaches a saturation stage.

The signal $f_0$ corresponds to the case where the weighting coefficient K applied to the signal $e_0$ is zero. This signal reproduces the signal $f_1$ with the delay T.

For weighting coefficients different from these two extreme cases, the combination signal has the course represented by the curve $f_K$.

The signals $f_1$ and $f_0$ reach the threshold value at times t1 and t0, respectively, while the signal $f_K$ reaches this threshold at time 8. The interval between t1 and t0 is equal to the delay T. Hence the minimum and maximum delays, respectively, of the combination signal with respect to the input signal are between t1 and t0, respectively. Consequently, the delay obtained in the general case will have a value $\Theta$ between t1 and t1+T.

The timing diagram (c) shows the output signal of the shaping circuit F in each of the three cases shown in the timing diagram (b). Hence the signals s1 and s0 have an edge at times t1 and t0, respectively. For a given coefficient K, the output signal $f_K$ will have an edge delayed by a value of $T_K$ with respect to the signal s1, the value $T_K$ being between 0 and T.

The way in which the delay $\Theta$ varies as a function of the weighting coefficient K depends essentially on the transition time tm defined above and on the fixed delay T. The transition time tm will define the minimum delay t1 of the output signal $s_K$ with respect to the input signal $e_0$. In the perfectly linear case as shown, this minimum delay is equal to half the transition time.

FIGS. 3-6 show the variations in the delay $T_K$ as a function of the coefficient K for different values of the transition time tm, the fixed delay T being assumed to be fixed.

Figure 3:
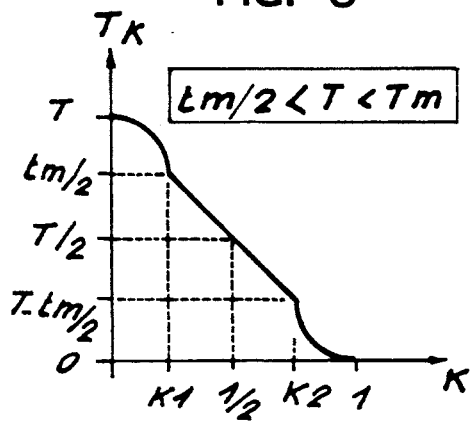
FIGS. 3–6 show the variations in the delay as a function of the set-point delay for various dimensions of the circuit of FIG. 1.

FIG. 3 corresponds to the case where T is between the transition time tm and one-half of that time, in accordance with the example of FIG. 2.

If K is between 0 and a first value K1, then $T_K$ varies between T and tm/2 in accordance with a hyperbolic function. If K is between the first value K1 and a second value K2, then $T_K$ varies linearly between tm/2 and T−tm/2. Finally, if K is between K2 and 1, $T_K$ varies between T−tm/2 and 0, by a different hyperbolic function.

Calculation makes it easy to verify this result and to show that K1=1−tm/2T and K2=tm/2T. It is also easy to verify that $T_K$ always equals T/2 when K=½.

Figure 4:
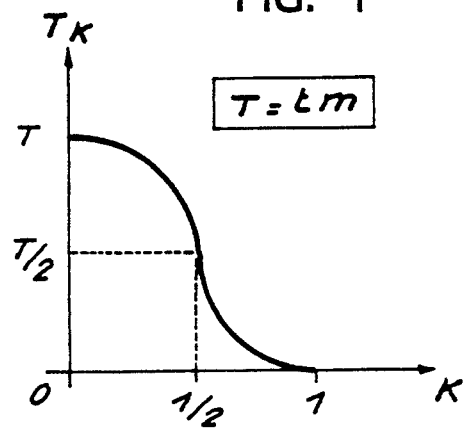

When T=tm, $T_K$ varies as a function of K in accordance with the curve shown in FIG. 4. It can easily be verified that the curve obtained is made up of two hyperbolic segments, and that the linear portion is absent.

Figure 5:
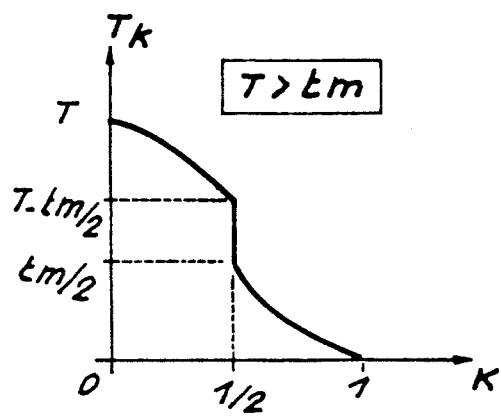

If T is greater than tm, as shown in FIG. 5, the curve has a discontinuity if K=½.

Figure 6:
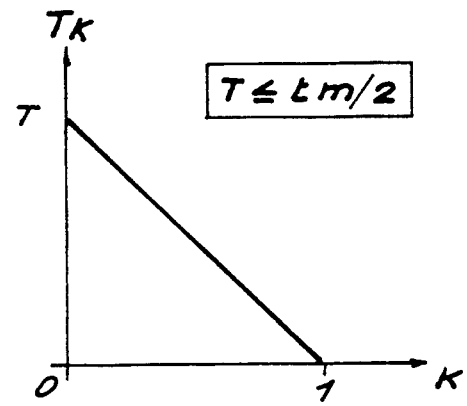

Finally, if T is less than or equal to tm/2, then $T_K$ varies linearly as a function of K over the entire adjustment range, as can be seen from FIG. 6.

The above analysis makes it possible to draw some conclusions about how to dimension the the fixed delay circuit and the combination circuit. First, it appears that T must be less than tm, to prevent any discontinuity of the delay $T_K$ as a function of the weighting coefficient K and hence of the set-point delay. On the other hand, a perfectly linear response of the delay $T_K$ is obtained as a function of K as soon as T is less than or equal to tm/2. Thus, for a fixed tm, a linear response is obtained, while having the widest possible range of adjustment when T is equal to tm/2.

The fixed delay T determines the range of adjustment of the delay. Hence for a predetermined range, it will always be possible to obtain a linear response by selection tm to be equal to 2T. However, it may be necessary to choose a shorter transition time, to reduce the minimum delay t1, which depends directly on the transition time tm.

Generally, the choice of T and tm will be the result of a compromise between the minimum delay, the range of adjustment, and the linearity of the delay with respect to the set-point delay.

Figure 7:
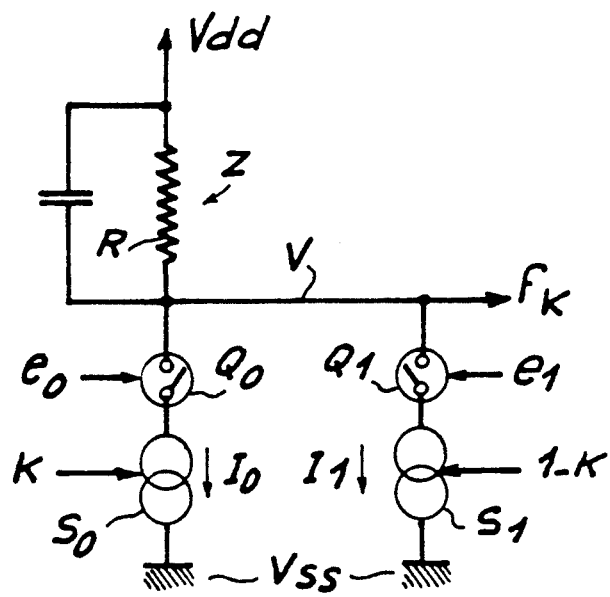
FIG. 7 shows the basic layout of an ECL version of the delay circuit according to the invention.

FIG. 7 shows the basic layout of the combination circuit C with a view to making it by ECL technology.

The circuit shown is supplied by two supply potentials Vdd and Vss, corresponding to a positive potential and ground, respectively. An impedance Z formed by a resistor R and a parallel capacitor has a first terminal connected to the positive potential Vdd and a second terminal connected to two current sources S0 and S1, by way of two switches Q0 and Q1, respectively. The switches Q0 and Q1 are controlled by the signals $e_0$ and $e_1$. The current sources S0 and S1 are adjustable current sources, controlled by the weighting coefficients K and $1-K$, respectively, and furnishing currents I0 and I1, respectively, which are complementary and are proportional to the corresponding weighting coefficients.

This assembly thus achieves a superposition of the currents I0 and I1 in the impedance Z, whose capacitance is responsible for the integration effect.

The potential V of the second terminal constitutes the measurement of the combination signal $f_K$, and the time constant of the impedance Z will make it possible to define the transition time tm.

The operation of the circuit of FIG. 7 may be explained with the aid of the timing diagrams of FIG. 2. In the ensuing explanation, positive logic will be used, and it will be assumed that the switches are open or closed depending on whether the signals that control them are at 0 or at 1, respectively.

Initially, until time 0, since the signals $e_0$ and $e_1$ are at 0, the potential V is equal to Vdd. When $e_0$ changes to 1, the switch Q0 closes, and a current $I0 = KI$ circulates in the impedance Z. The potential V then decreases, with the time constant of the impedance Z, toward the value $Vdd - KRI$, during a period of time equal to the fixed delay T. The signal $e_1$ then changes to 1, Q1 closes, and a current $(1-K)I$ is added to the current KI in the impedance Z. The potential V then continues to decrease to the value $Vdd - RI$, with the same time constant.

Consequently, $e_0$ changes back to 0, and Q0 closes. The potential V then rises again to $Vdd - (1-K)RI$ during the period T with the same time constant. Finally, $e_1$ changes back to zero, Q0 closes, and the potential V continues to rise to Vdd.

The circuit accordingly performs the superposition, with an integral effect, of the variables $Ke_0$ and $(1-K)e_1$. Naturally, the signals $f_1$, $f_0$ and $f_K$ in reality have variations that are more progressive than those shown in FIG. 2(b), particularly in the vicinity of the saturation stage. Nevertheless, this difference does not substantially modify the results obtained, if the transition time tm is defined as the time interval during which the signals $f_1$ and $f_0$ vary practically linearly as a function of the time.

Figure 8:
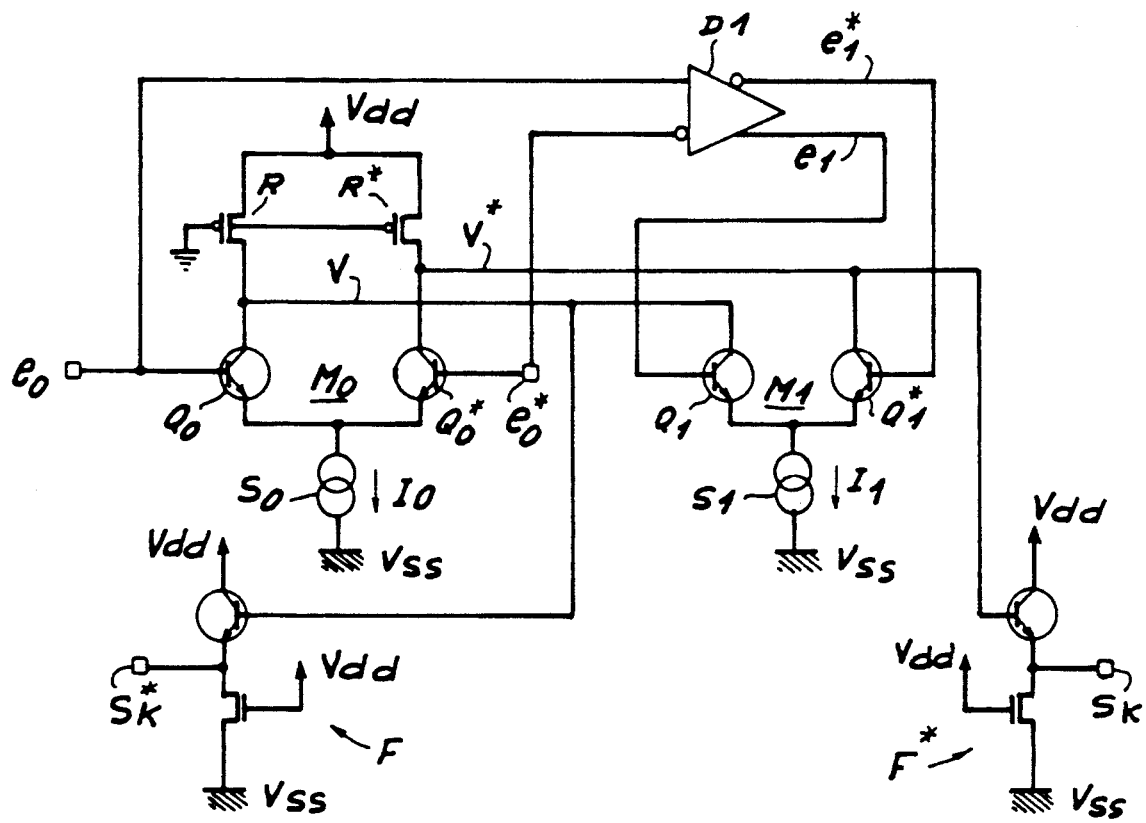
FIGS. 8–10 show a detailed ECL embodiment.

FIG. 8 shows an ECL version of the combination circuit C. This circuit includes two resistors R, R*, of the same value, embodied for example by MOS transistors, each having a first terminal connected to the supply potential Vdd. A first and a second current source S0, S1 furnish currents I0, I1, respectively, which are proportional to the coefficients K and $1-K$, respectively. A first differential array M0 is formed of two bipolar transistor M0, Q0*, whose collectors are connected to the second terminal of the resistors R and R*, respectively, and whose emitters are connected to the current source S0. A second differential array M1, identical to M0, is formed of bipolar transistors Q1 and Q1*, whose collectors are connected to the second terminal of the resistors R and R*, respectively, and whose emitters are connected to the second current source S1.

The input signal is a differential signal $e_0$, $e_0^*$, controlling the bases of the transistors Q0 and Q0*. The differential signal $e_0$, $e_0^*$ is also applied to the input of a differential amplifier D1, which plays the role of the fixed delay circuit. The amplifier D1 furnishes a delayed differential signal $e_1$, $e_1^*$ controlling the bases of the transistors Q1 and Q1*. The differential voltage V, V* between the two terminals of the resistors R and R* constitutes the measurement of the combination signal. Two emitter follower arrays F, F* are controlled by the differential combination signal V, V* and at their output furnish a differential output signal $s_K$, $s_K^*$.

The operation of the circuit of FIG. 8 will easily be deduced from that of FIG. 7, except that the signals are of the differential type. It should be noted that the impedance Z of FIG. 7 is formed for each path of the resistor R or R* and of the set of capacitances which are connected to the resistor, such as the collector-to-base capacitances of the bipolar transistors. In the case where the resistors R and R* are formed by MOS transistors, it is also appropriate to take the drain-to-gate capacitances of these transistors into account.

Figure 9:
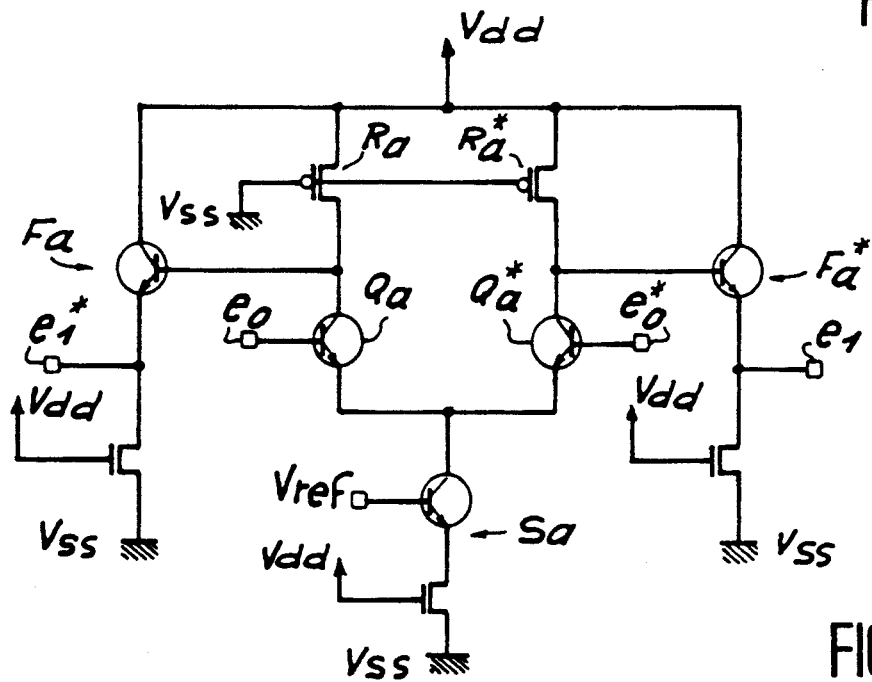

The differential amplifier D1 is an ECL amplifier of the conventional type, as shown in FIG. 9. It is constituted for each path of a resistor Ra, Ra*, of which a first terminal is connected to the terminal Vdd and of which the second terminal is connected to the collector of a bipolar transistor Qa, Qa*. The emitters of the transistors Qa, Qa* are connected to a current source Sa dimensioned to furnish a current equal to the maximum value I of the current furnished by the sources S0 and S1. The circuit is completed by two emitter followers Fa, Fa*, whose inputs are connected to the second terminals of the resistors Ra, Ra*, respectively. The outputs of the emitter followers Fa, Fa* furnish the delayed differential signal $e_1$, $e_1^*$.

It can be confirmed that this circuit introduces a delay defined by the time constant that for each path is due to the resistance of Ra, Ra* and to the capacitances of the transistors connected to the resistor. Consequently, if the resistors Ra and Ra* have the same resistance as the resistors R and R*, and if the transistors of the amplifier have the same dimensions as those of the homologous arrays of the combination circuit, then it is assured that the fixed delay of the amplifier will always be less than the transition time of the combination circuit.

The dimensioning of the components of the circuit (width of the transistors) may certainly be calculated with a view to adjusting the fixed delay T and the transition time tm to selected values, for example, in order to verify $T = tm/2$. An additional fixed delay circuit may also be provided, connected downstream of D1, along with another differential array connected in parallel to M0 and M1, supplied by a different current source and controlled by the additional delay circuit with a view to adding one adjustment range. In that case, in taking the balance of the transistors involved, it may be verified that the equivalent capacitance, and hence the time constant, of the circuit of FIG. 8 is nearly twice that of FIG. 9, which automatically satisfies the optimum condition T=tm/2.

Figure 10:
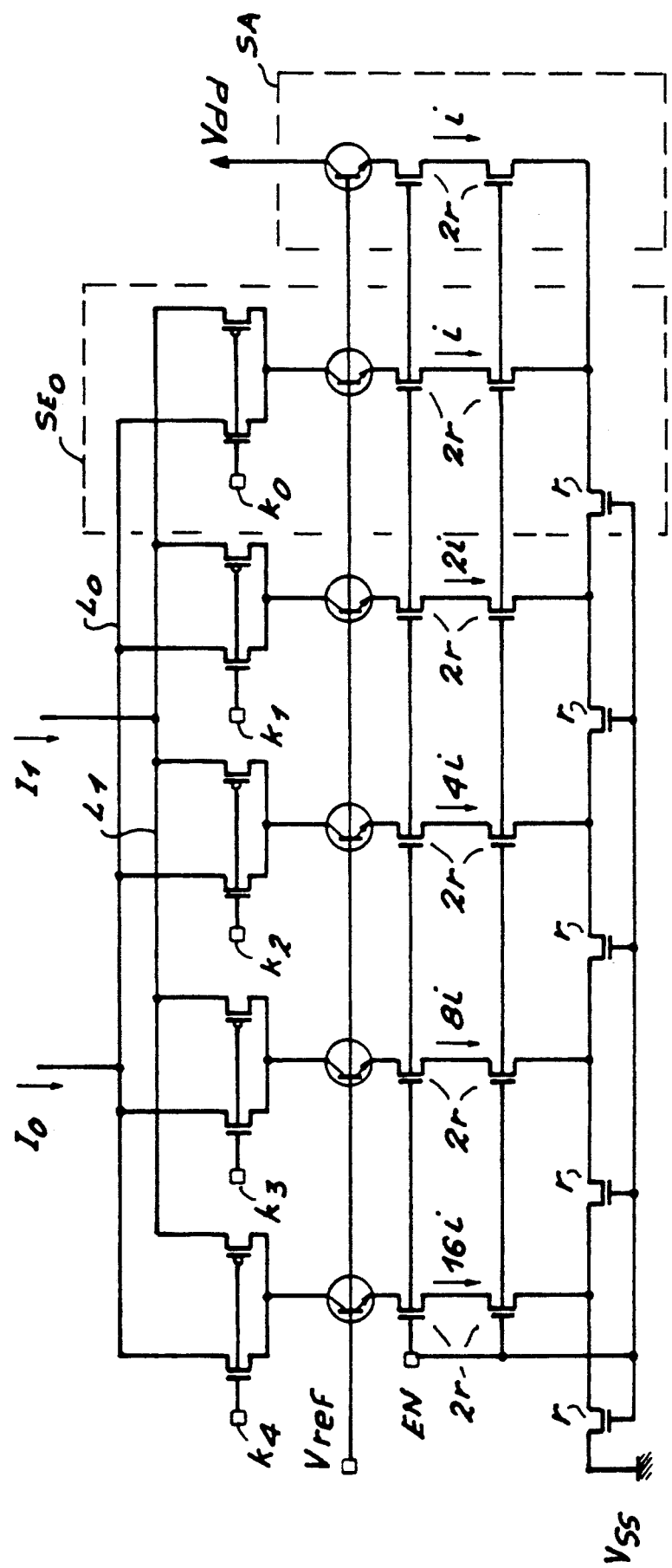

FIG. 10 shows a circuit with which the two variable current sources S0 and S1 may be realized.

In this embodiment, the coefficient K is in the form of a binary number represented by the five signals k0−k4, where k0 corresponds to the least significant bit. In this case, K can then assume 32 different values distributed uniformly between 0 and 1 (except for a multiplier coefficient).

Naturally, the embodiments for an arbitrary number of bits will easily be deduced in this particular case.

The circuit includes a first and a second set of resistors whose resistance has the value r and 2r, respectively. The resistors r are realized here by means of n-channel MOS transistors, and the resistors 2r are formed by two n-channel MOS transistors of the same size, connected in series. All these MOS transistors have their gate polarized by the voltage EN which outputs them in the saturated mode.

The circuit includes a first subassembly SA including a bipolar transistor whose collector is connected to the potential Vdd, whose emitter is connected to a first terminal of a resistor 2r, and whose case receives a polarization voltage Vref.

A second subassembly SE0 includes another bipolar transistor, whose base receives the same polarization voltage Vref and whose emitter is connected to a first terminal of another resistor 2r, whose second terminal is connected to the second terminal of the resistor 2r of the subassembly SA, and to a first terminal of a resistor r. The collector of the bipolar transistor is connected to two lines L0 and L1 by way of an n-channel MOS transistor and a p-channel MOS transistor, respectively, whose gates receive the signal k0.

The circuit includes four other subassemblies (not identified by reference numeral) which are identical to SEI, and whose MOS transistors receive the signals k1-k4 at their respective gates. These four subassemblies are connected in the manner indicated in FIG. 10.

The lines L0 and L1 are connected to the module M0 and M1 of FIG. 8.

It can easily be verified that the circuit of FIG. 10 furnishes currents Ix and Iy that are proportional to K and 1−K, respectively.

Figure 11:
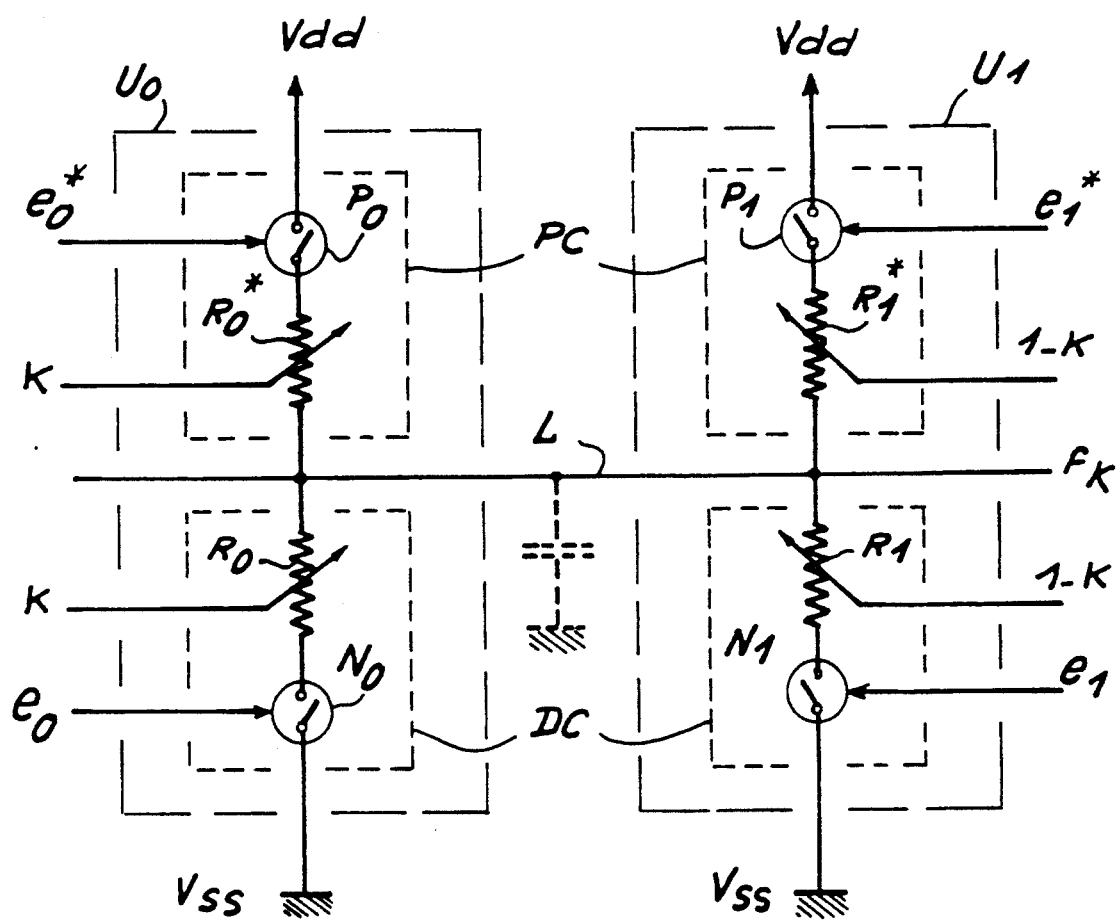
FIG. 11 shows the basic layout of a CMOS embodiment.
Figure 12:
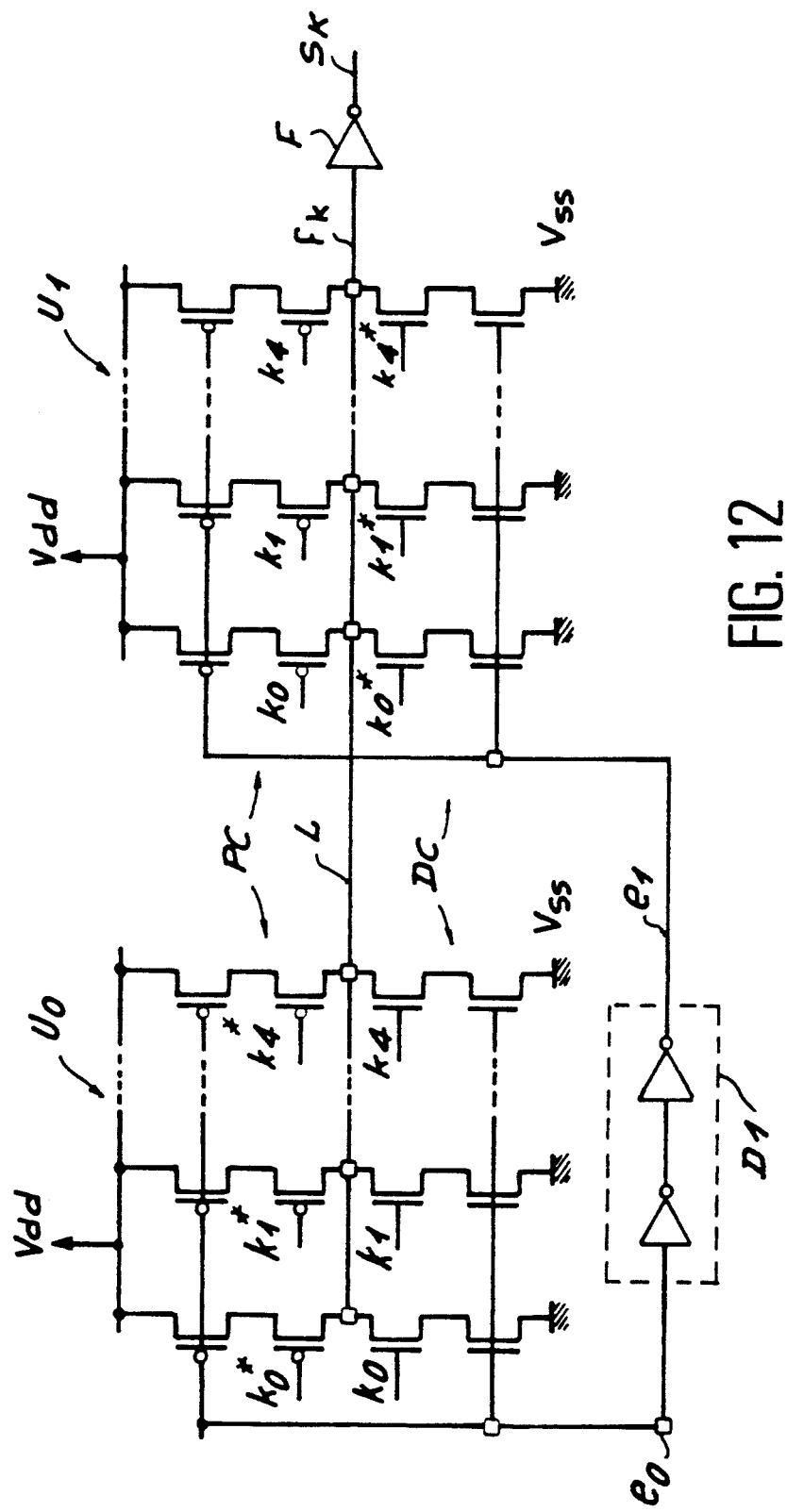
FIG. 12 shows a detailed CMOS embodiment.

FIGS. 11 and 12 relate to a different embodiment, in CMOS technology, of the combination circuit 2.

FIG. 11 is the schematic illustration of a CMOS embodiment that makes this embodiment easier to understand. The circuit includes a first and a second charging and discharging module U0, U1 of a common line L. Each module U0, U1 includes a charging circuit PC and a discharging circuit DC. Each charging circuit PC or discharging circuit DC includes a variable resistor R0*, R0, R1*, R1 and a switch P0, N0, P1, N1 controlling the connection by this resistor between the line L and the supply potential Vdd for the charging circuit and Vss for the discharging circuit. The switches of the units U0 and U1 are controlled by the signals $e_0$ and $e_1$ and their complements, respectively. The variable resistors R0, R0* are controlled in such a way as to assume a value that is inversely proportional to the coefficient K, while the resistors R1, R1* of the unit U1 are controlled in such a way as to assume a value that is inversely proportional to one 1−K. The potential of the line L, constitutes the measurement of the combination signal $f_K$.

To explain the operation of the circuit of FIG. 11, we will assume that the line L is initially charged to the potential Vdd, and that the signals $e_0$ and $e_1$ are at 0. The switches P0 and P1 are then closed while the switches N0 and N1 are open. When the signal $e_0$ becomes active, the switch N0 closes and the switch P0 opens. The circuit then has a time constant defined by the structural capacitance at the level of the line L and a resistance equivalent to the resistors R0 and R1* connected in parallel. Since R0 and R1* are inversely proportional to K and 1−K, respectively, the time constant is independent of K. The line L will then discharge with this time constant, from the value Vdd to the value (1−K)Vdd.

Discharging continues in this way until the moment when the signal $e_1$ becomes active. At that time, the switch N1 closes and the switch P1 opens. The line L then continues to discharge toward 0 with the same time constant as before.

When the signal $e_0$ becomes inactive again, the switch P0 closes and the switch N0 opens, which reestablishes a charging circuit for the line L to the voltage K Vdd. When $e_1$ becomes inactive again, the situation is as at the outset.

It can be verified that the behavior of the circuit of FIG. 11 is identical from the standpoint of the delay to that of the ECL version.

FIG. 12 shows the detailed CMOS embodiment corresponding to the circuit of FIG. 11. The charging and discharging circuits PC and DC are constituted by p- and n-channel MOS transistors, respectively. The variable resistors R0, ..., R1* are embodied by means of MOS transistors connected in parallel and controlled by the signals k0, ..., k4, k0*, ..., k4*, with the associated switches being constituted by the drain-to-source paths of MOS transistors whose gates receive the associated signal $e_0$, $e_1$.

The fixed delay circuit is embodied by means of two cascade-connected CMOS inverters.

The structural capacity defining the time constant is due to the drain-to-source capacitances of the active MOS transistors connected to the line L. By the design of the circuit, the resultant structural capacitance remains constant, regardless of the value of K.

On the other hand, the MOS transistors constituting the variable resistors of each charging or discharging circuit may be dimensioned in such as way that their resistances vary by a power of 2, depending on the weight or significance of the control signals k0, ..., k4, ..., k0*, ..., k4*.

Another possibility is to replace the variable-sized transistors with parallel and serial arrays of identical transistors.

The operation of the circuit of FIG. 12 is identical in principle to that of FIG. 11 and hence requires no additional explanation.

We claim:

1. A delay circuit for furnishing an output signal ($s_K$) having a delay (Θ) with respect to a logical input signal ($e_0$), said delay (Θ) being adjustable as a function of a set-point delay (CN), said circuit being characterized in that it includes a fixed delay circuit (D1) receiving said input signal ($e_0$) and furnishing a delayed signal ($e_1$) having a fixed delay (T) with respect to the input signal ($e_0$), and a combination circuit (C) with two inputs (X, Y) receiving said input signal ($e_0$) and said delayed signal ($e_1$), respectively, and including a control input (CD) receiving a control variable (K) representing said set point, said combination circuit being designed in such a way as to furnish at its output a combination signal ($f_K$) resulting from the superposition with weighing and an integral effect of the signals applied to its inputs (X, Y), said weighing consisting in assigning two weighing coefficients associated respectively with the input signal ($e_0$) and the delayed signal ($e_1$), whose values are a function of said control variable (K); and that said combination circuit (C) or said fixed delay circuit (D1) are dimensioned such that said fixed delay (T) is less than the transition time ($t_m$) that the combination signal ($f_K$) has when the combination circuit (C) receives only the input signal ($e_0$), and further wherein said combination circuit (C) includes a first and a second current source (S0, S1), respectively furnishing currents (I0, I1) that are proportional to said weighing coefficients; that said current sources (S0, S1) are connected to a terminal of a common impedance (Z) by way of two switch means (Q0, Q1), respectively, which are controlled by the input signal ($e_0$) and the delayed signal ($e_1$), respectively, the potential (V) of said terminal constituting the measurement of said combination signal ($f_K$).

2. The delay circuit of claim 1, characterized in that the sum of the two weighing coefficients is constant.

3. The delay circuit of claim 2, characterized in that said input signal ($e_0$) and said delayed signal ($e_1$) are differential signals ($e_0$, $e_0^*$ and $e_1$, $e_1^*$, respectively); that said combination circuit (C) includes a first and a second resistor (R, R*) each having a first terminal connected to a supply potential (Vdd); that said combination circuit (C) further includes a first and a second current source (S0, S1) associated with a first and a second different array (M0, M1), respectively, each differential array (M0, M1) being formed by two bipolar transistors (Q0, Q0*, Q1, Q1*), whose collectors are connected to the second terminal of said first and resistors (R, R*), respectively, and whose emitters are connected to the associated current source (S0, S1); that the bases of the transistors (Q0 Q0*) of the first differential array (N0) receive said differential input signal ($e_0$, $e_0^*$); that the basis of the transistors (Q1, Q1*) of the second differential array (M1) receive said delayed differential signal ($e_1$, $e_1^*$); and that said first and second current sources (S0, S1) respectively furnish currents (I0, I1) that are proportional to said weighing coefficients, the differential voltage (V, V*) between the two terminals of said resistors constituting the measurement of said combination signal ($f_K$).

4. The delay circuit of claim 3, characterized in that said fixed delay circuit (D1) is a differential amplifier embodied by ECL technology.

5. The delay circuit of claim 2, characterized in that said combination circuit (C) includes a first and a second charging and discharging module (U0, U1) of a common line (L), which are controlled respectively by said input signal ($e_0$) and said delayed signal ($e_1$), the potential of said common line (L) constituting the measurement of said combination signal ($f_K$); that each module (U0, U1) includes a discharging circuit (DC) and a charging circuit (PC) each including switch means (P0, N0, P1, N1) controlling the connection between said common line (L) and a first and a second respective supply potential (Vss, Vdd) by way of a variable resistor (R0, R0*, R1, R1*), the variable resistor (R0, R0*, R1, R1*) of the charging and discharging circuits (DC, PC) of each module (U0, U1) being controlled in such a way as to assume a value that is inversely proportional to the weighting coefficient of the associated signal ($e_0$, $e_1$); and that the switch means (P0, N0, P1, N1) of the discharging circuit (DC) and the charging circuit (PC) of each module (U0, U1) are activated by a first and a second voltage level, respectively, of the associated signal ($e_0$, $e_1$).

6. The delay circuit of claim 5, characterized in that the variable resistors (R0, R0*, R1, R1*) of each module (U0, U1) are embodied by means of a plurality of elementary resistors that can be connected selectively in parallel as a function of the weighting coefficient of the signal ($e_0$, $e_1$) associated with said module (U0, U1).

7. The delay circuit of claim 6, characterized in that said resistors (R0, R0*, R1, R1*) and said switches (P0, N0, P1, N1) are formed by the drain-to-source paths of MOS transistors whose gates are controlled respectively as a function of said weighting coefficients and by said associated signals ($e_0$, $e_1$).

8. The delay circuit of claim 7, characterized in that the MOS transistors connecting said common line (L) to said high and low supply potentials (Vdd, Vss), respectively, are p-channel and n-channel transistors, respectively.

9. The delay circuit of claim 8, characterized in that said fixed delay circuit (D1) is embodied by means of inverter circuits made by CMOS technology.

10. The delay circuit of claim 1, characterized in that said combination circuit (C) includes a first and a second charging and discharging module (U0, U1) of a common line (L), which are controlled respectively by said input signal ($e_0$) and said delayed signal ($e_1$), the potential of said common line (L) constituting the measurement of said combination signal ($f_K$); that each module (U0, U1) includes a discharging circuit (DC) and a charging circuit (PC) each including switch means (P0, N0, P1, N1) controlling the connection between said common line (L) and a first and a second respective supply potential (Vss, Vdd) by way of a variable resistor (R0, R0*, R1, R1*), the variable resistor (R0, R0*, R1, R1*) of the charging and discharging circuits (DC, PC) of each module (U0, U1) being controlled in such a way as to assume a value that is inversely proportional to the weighting coefficient of the associated signal ($e_0$, $e_1$); and that the switch means (P0, N0, P1, N1) of the discharging circuit (DC) and the charging circuit (PC) of each module (U0, U1) are activated by a first and a second voltage level, respectively, of the associated signal ($e_0$, $e_1$).

11. A delay circuit for furnishing an output signal ($s_K$) having a delay (Θ) with respect to a logical input signal ($e_0$), said delay (Θ) being adjustable as a function of a set-point delay (CN), said circuit being characterized in that it includes a fixed delay circuit (D1) receiving said input signal ($e_0$) and furnishing a delayed signal ($e_1$) having a fixed delay (T) with respect to the input signal ($e_0$), and a combination circuit (C) with two inputs (X, Y) receiving said input signal ($e_0$)) and said delayed signal ($e_1$), respectively, and including a control input (CD) receiving a control variable (K) representing said set point, said combination circuit being designed in such a way as to furnish at its output a combination signal ($f_K$) resulting form the superposition with weighing and an integral effect of the signals applied to its inputs (X, Y), said weighing consisting in assigning two weighing coefficients associated respectively with the input signal ($e_0$) and the delayed signal ($e_1$), whose values are a function of said control variable (K); and that said combination circuit (C) or said fixed delay circuit (D1) are dimensioned such that said fixed delay (T) is less than the transition time ($t_m$) that the combination signal ($f_K$) has when the combination circuit (C) receives only the input signal ($e_0$), wherein the sum of the two weighing coefficients is constant, and further wherein said combination circuit (C) includes a first and second charging and discharging module (U0, U1), of a common line (L), which are controlled respectively by said input signal ($e_0$) and said delayed signal ($e_1$), the potential of said common line (L) constituting the measurement of said combination signal ($f_K$); that each module (U0, U1) includes a discharging circuit (DC) and a charging circuit (PC) each including switch means (P0, N0, P1, N1) controlling the connection between said common line (L) and a first and a second respective supply potential (Vss, Vdd) by way of a variable resistor (R0, R0*, R1, R1*), the variable resistor (R0, R0*, R1, R1*) of the charging and discharging circuits (DC, PC) of each module (U0, U1) being controlled in such a way as to assume a value that is inversely proportional to the weighing coefficient of the associated signal ($e_0$, $e_1$); and that the switch means (P0, N0, P1, N1) of the discharging circuit (DC) and the charging circuit (PC) of each module (U0, U1) are activated by a first and a second voltage level, respectively, of the associated signal ($e_0$, $e_1$).

* * * * *

UNITED STATES PATENT AND TRADEMARK OFFICE
CERTIFICATE OF CORRECTION

PATENT NO. : 5,327,031
DATED : July 5, 1994
INVENTOR(S) : Roland MARBOT et al

It is certified that error appears in the above-indentified patent and that said Letters Patent is hereby corrected as shown below:

Column 10, line 59 (Claim 11, line 14) "form" should be --from--.

Signed and Sealed this

Eleventh Day of October, 1994

Attest:

BRUCE LEHMAN

*Attesting Officer*  *Commissioner of Patents and Trademarks*